US012652882B2

(12) United States Patent
Arbell

(10) Patent No.: US 12,652,882 B2
(45) Date of Patent: Jun. 9, 2026

(54) SUPERLATTICE STRUCTURE FOR THIN FILM SOLAR CELLS

(71) Applicant: ARBELL ENERGY LTD, Ramat Hasharon (IL)

(72) Inventor: Matan Arbell, Ramat Hasharon (IL)

(73) Assignee: ARBELL ENERGY LTD, Ramat Hasharon (IL)

( * ) Notice: Subject to any disclaimer, the term of this patent is extended or adjusted under 35 U.S.C. 154(b) by 0 days.

(21) Appl. No.: 18/977,230

(22) Filed: Dec. 11, 2024

(65) Prior Publication Data

US 2025/0107269 A1      Mar. 27, 2025

Related U.S. Application Data

(62) Division of application No. 17/766,565, filed as application No. PCT/IL2020/050904 on Aug. 17, 2020, now Pat. No. 12,199,204.

(60) Provisional application No. 62/911,646, filed on Oct. 7, 2019.

(51) Int. Cl.
*H10F 77/14*         (2025.01)
*H10F 77/169*        (2025.01)

(52) U.S. Cl.
CPC ....... *H10F 77/146* (2025.01); *H10F 77/1433* (2025.01); *H10F 77/169* (2025.01)

(58) Field of Classification Search
CPC ..... H10F 10/00–19; H10F 71/00–1395; H10F 77/00–959
USPC ................................................. 136/243–265
See application file for complete search history.

(56) References Cited

U.S. PATENT DOCUMENTS

| | | | |
|---|---|---|---|
| 5,720,827 A | 2/1998 | Simmons | |
| 2007/0012355 A1 | 1/2007 | LoCascio et al. | |
| 2008/0142075 A1 | 6/2008 | Reddy et al. | |
| 2009/0255580 A1 * | 10/2009 | Dasgupta | H10F 77/146 977/774 |
| 2011/0146775 A1 | 6/2011 | Kim et al. | |
| 2012/0097228 A1 | 4/2012 | Yoshikawa et al. | |

(Continued)

FOREIGN PATENT DOCUMENTS

| | | |
|---|---|---|
| CN | 101546703 A | 9/2009 |
| JP | 2001007381 A | 1/2001 |

(Continued)

OTHER PUBLICATIONS

JP-2011086774-A English (Year: 2011).*

(Continued)

*Primary Examiner* — Bach T Dinh
(74) *Attorney, Agent, or Firm* — CANTOR COLBURN LLP

(57)          ABSTRACT

A superlattice structure for a thin film solar cell includes superimposed layers of nanocrystals and is configured to generate a flow of electrons across the layers when it is irradiated by a solar radiation. Each of the layers includes an array of nanocrystals which have substantially the same size and shape and the nanocrystals of each of the layers have different size and/or different shape with respect to the nanocrystals of the other layers. The layers are sorted in such an order that the superlattice structure is anisotropic. A thin film solar cell having the superlattice structure and a method for making the superlattice structure is related.

3 Claims, 2 Drawing Sheets

(56)                References Cited

U.S. PATENT DOCUMENTS

| | | | | |
|---|---|---|---|---|
| 2014/0326302 | A1* | 11/2014 | Arakawa | B82Y 20/00 |
| | | | | 977/948 |
| 2015/0357534 | A1* | 12/2015 | Dasgupta | H10F 10/17 |
| | | | | 977/774 |
| 2015/0364628 | A1 | 12/2015 | Nozawa et al. | |
| 2024/0105868 | A1 | 3/2024 | Arbell | |

FOREIGN PATENT DOCUMENTS

| | | | | |
|---|---|---|---|---|
| JP | 2011086774 | A | * | 4/2011 |
| JP | 2012089756 | A | | 5/2012 |
| JP | 2012094588 | A | | 5/2012 |
| JP | 2012216600 | A | | 11/2012 |
| JP | 2014154816 | A | | 8/2014 |
| JP | 2014241324 | A | | 12/2014 |
| JP | 2016127183 | A | | 7/2016 |
| WO | 2013058051 | A1 | | 4/2013 |

OTHER PUBLICATIONS

Examination Report for Chinese Application No. 202080070387.1; dated Jan. 3, 2024; 12 pages.

Examination Report for Chinese Application No. 2020800703871; dated May 29, 2023; 15 pages.

Examination Report for Israel Application No. 292010; dated Dec. 12, 2023; 3 pages.

International Search Report issued Feb. 12, 2021 re: Application No. PCT/IL2020/050904, pp. 1-2, citing: US 2012/0097228 A1, US 2007/0012355 A1, US 2015/0364628 A1 and M. Singh et al. "Size and shape effects . . . ".

Japanese Office Action for Application No. 2022-521163, dated Jul. 30, 2024, 9 pages with translation.

M. Singh et al. "Size and shape effects on the band gap of semiconductor compound nanomaterials" Journal of Taibah University for Science, May 30, 2018, vol. 12, No. 4 pp. 470-475.

Supplementary European Search Report for European Application No. 20873511.8; dated Dec. 1, 2023; 11 pages.

Supplementary European Search Report for European Application No. 20873511.8; dated Aug. 30, 2023; 12 pages.

Written Opinion issued Feb. 12, 2021 re: Application No. PCT/IL2020/050904, pp. 1-8.

* cited by examiner

SUPERLATTICE STRUCTURE FOR THIN FILM SOLAR CELLS

CROSS-REFERENCE TO RELATED APPLICATIONS

This application is a divisional of U.S. patent application Ser. No. 17/766,565, filed on Apr. 5, 2022, which is a 35 U.S.C. § 371 National Stage patent application of PCT/IL2020/050904, filed on Aug. 17, 2020, which claims the benefit of U.S. patent application No. 62/911,646, filed on Oct. 7, 2019, the disclosures of which are incorporated herein by reference in their entirety.

TECHNICAL FIELD

The present disclosure relates to a superlattice structure for a thin film solar cell, a thin film solar cell comprising the superlattice structure and a method for making the superlattice structure.

BACKGROUND

As known, a solar cell, or photovoltaic cell, is a device that converts the energy of light directly into electricity by the photovoltaic effect.

The most relevant characteristic of a solar cell is its efficiency, i.e. the portion of energy in the form of sunlight radiation that can be converted into electricity by the solar cell.

The solar cells of the first generation—also called conventional, traditional or wafer-based cells—are usually made of crystalline silicon and more precisely include materials such as polysilicon and monocrystalline silicon. Individual traditional solar cells are commonly combined to form modules, otherwise known as solar panels.

These silicon-based solar cells provide relatively high efficiency (in terms of energy conversion efficiency) at competitive costs and therefore, nowadays, are still commercially predominant.

In the state of the art, the traditional silicon-based solar cells, which use a single p-n junction, have a maximum efficiency of about 30%.

It is known that these traditional silicon-based solar cells, which use a single p-n junction, have a maximum theoretical efficiency, known as "Shockley-Queisser limit", of 33%-34%.

Multi junction solar cells are also known which have a higher efficiency limit, but they are very expensive and not easy to manufacture: their higher complexity and manufacturing price have limited their use to special roles, notably in aerospace where their high power-to-weight ratio is desirable.

In addition to the above mentioned limit of efficiency, the silicon-based solar cells have other limitations, especially regarding versatility, weight and dimension, production speed and features such as flexibility.

Over the course of time, a second generation of solar cells, commonly known as thin film solar cells, have been developed.

The known thin film solar cells are normally made by depositing one or more thin layers, or thin film (TF) of photovoltaic material on a substrate, such as glass, plastic or metal. The thin film usually comprises materials such as cadmium telluride (CdTe), copper indium gallium diselenide (CIGS), and amorphous thin-film silicon (a-Si, TF-Si).

The film thickness varies from a few nanometers (nm) to tens of micrometers (μm) and thus the thin film solar cells are much thinner than the conventional silicon-based solar cells. This allows the thin film solar cells to be more flexible, and lower in weight and therefore more versatile than the crystalline silicon solar cells. Furthermore, these known thin film solar cells are cheaper than conventional crystalline silicon solar cells.

For example, nowadays, thin film solar cells are commonly used in building integrated photovoltaics and as semi-transparent photovoltaic glazing material that can be laminated onto windows.

However, at the state of the art, thin film solar cells are less efficient than conventional crystalline silicon solar cells.

In fact, the known thin film solar cells have a maximum efficiency of circa 10%.

Recently, new materials which can be used as absorbing photovoltaic material in a thin film solar cells have been studied, among which there are superlattice structures.

As known, the superlattice to which reference is made is a periodic structure comprising an array of nanocrystals, also known as "quantum dots" or "quantum wires", which are semiconductor particles a few nanometres in size. More precisely, such nanocrystals have a size that is less than the Bohr radius of the substance they are made of, so that they have peculiar optical and electronic properties due to quantum effects.

According to the known art, photovoltaic superlattices are isotropic structures wherein the nanocrystals are, in practice, shuffled.

Although theoretically very promising, these photovoltaic superlattices developed so far have not reached a sufficient efficiency to be useful in the commercial applications.

In fact, at the state of the art, the known thin film solar cells having superlattice as absorbing photovoltaic material have a maximum efficiency of about 8%-12%.

SUMMARY

The aim of the present disclosure is to solve the technical problem described above, obviates the drawbacks and overcomes the limitations of the background art, providing a thin film solar cell that has improved efficiency with respect to the prior art.

Within the scope of this aim, the disclosure provides a thin film solar cell that is easy to manufacture and at competitive costs.

Moreover, the present disclosure provides a thin film solar cell that is highly versatile.

The present disclosure also provides an alternative to known solutions. This aim, as well as these and other advantages that will become better apparent hereinafter, are achieved by providing a superlattice structure for a thin film solar cell, said superlattice structure comprising a plurality of superimposed layers of nanocrystals and being configured to generate a flow of electrons across said layers when it is irradiated by a solar radiation, wherein each of said layers comprises an array of nanocrystals which have substantially the same size and shape, and wherein the nanocrystals of each of said layers have different size and/or different shape with respect to the nanocrystals of the other layers;

said layers being sorted in such an order that said superlattice structure is anisotropic.

This aim and these advantages are also achieved by providing a thin film solar cell according to the claims.

This aim and these advantages are also achieved by providing a method for making a superlattice structure according to the claims.

BRIEF DESCRIPTION OF THE DRAWINGS

The foregoing, as well as further characteristics and advantages of the present disclosure, will become better apparent from the following description of a preferred, but not exclusive, embodiment of a superlattice structure, according to the disclosure, and of a thin film solar cell comprising the superlattice structure illustrated by way of nonlimiting example in the accompanying drawings, wherein.

It should be noted that the above mentioned drawings has to be intended as schematic, since them do not reflect the exact proportions, in order to better show the underlying structure of the disclosure.

DETAILED DESCRIPTION OF THE DISCLOSURE

Figure 1:
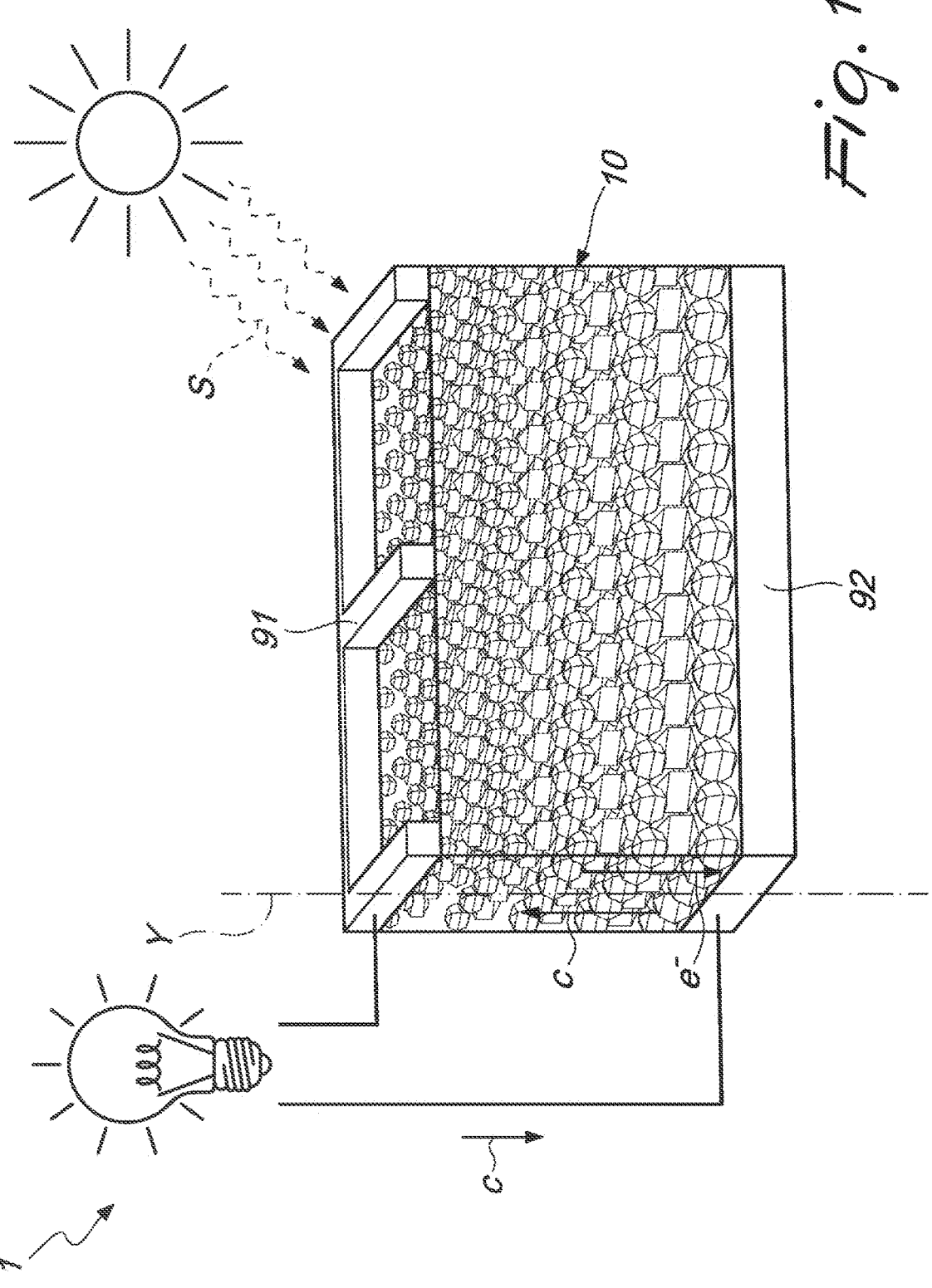
FIG. 1 is a schematic representation of a thin film solar cell, according to the disclosure.
Figure 2:
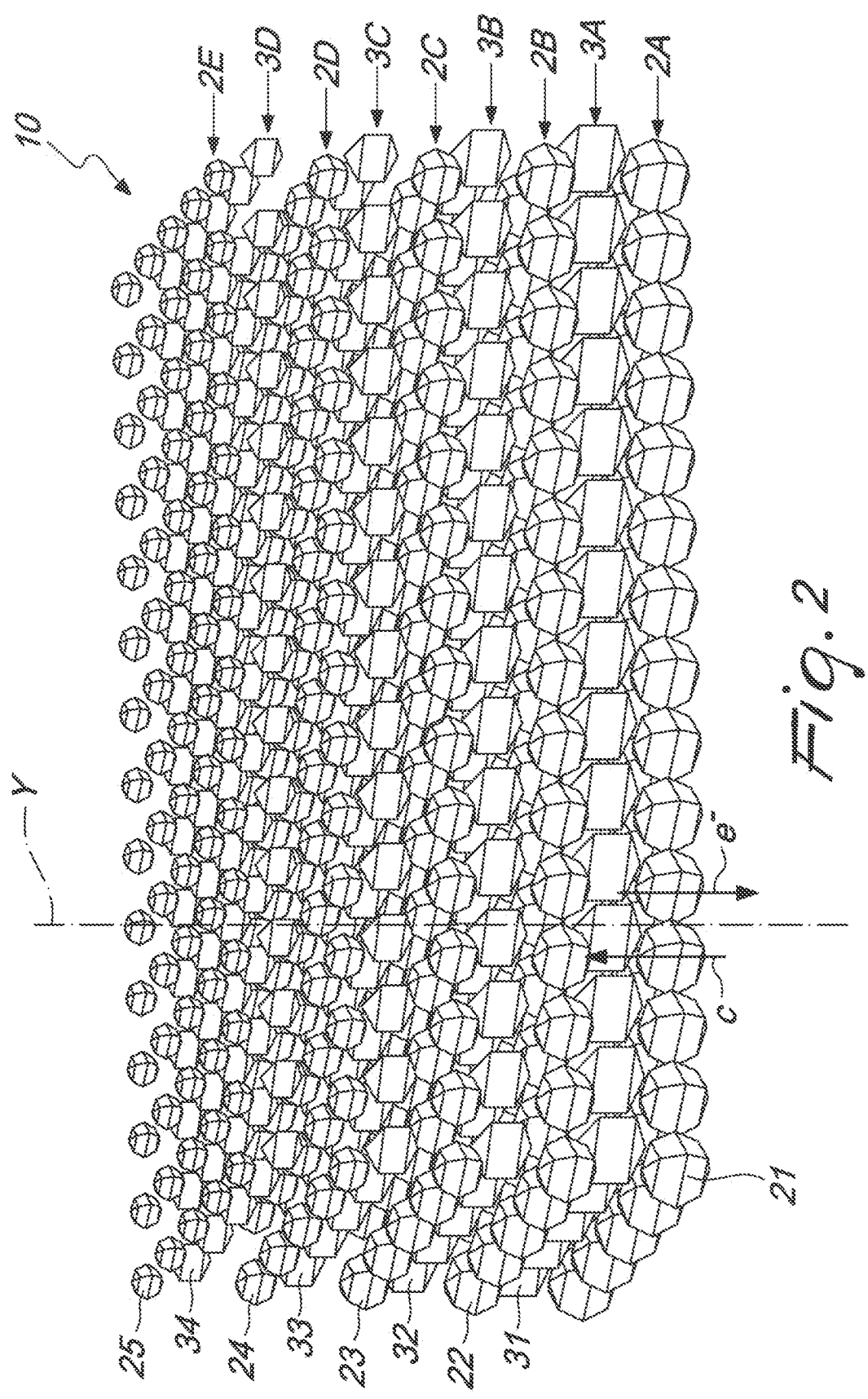
FIG. 2 is a schematic representation of a superlattice structure, according to the disclosure.

With reference to the cited FIGS. 1 and 2, the thin film solar cell, generally designated by the reference numeral 1, comprises a superlattice structure 10 (which is depicted in detail in FIG. 2).

The superlattice structure 10 comprises a plurality of superimposed layers 2A, 2B, 2C, 2D, 2E, 3A, 3B, 3C, 3D of nanocrystals 21, 22, 23, 24, 25, 31, 32, 33, 34 and is configured to generate a flow of electrons e⁻ across said layers 2A-2E, 3A-3E when it is irradiated by a solar radiation S, as will become better apparent hereinafter.

In the illustrated and not limiting embodiment of the superlattice structure 10, there are nine layers 2A-2E, 3A-3D, however the number of layers can be varied, depending on the embodiment. Preferably, the layers 2A-2E, 3A-3D are at least two; more preferably the layers 2A-2E, 3A-3D are in such a number to have a thickness of the superlattice structure 10 of less than 0.5 μm.

Each layer 2A-2E, 3A-3E comprises an array of nanocrystals 21-25, 31-35 which have substantially the same size and shape (within the same layer): all the nanocrystals 21 of the first layer 2A have substantially the same size and the same shape, all the nanocrystals 31 of the second layer 3A have substantially the same size and the same shape, and so on.

It is useful to specify that the term "shape", in the present description and in the attached claims, is understood to reference the mere geometry (i.e the geometric structure) of a nanocrystal, regardless of its size.

All the layers 2A-2E, 3A-3E lie on planes perpendicular to the transverse direction Y along which the electrical conductivity is required.

In other words, the cross direction Y is the direction defined by transverse axis Y which is perpendicular to the planes on which the layers 2A-2E, 3A-3E lie.

According to the disclosure, the nanocrystals of each of the layers 2A-2E, 3A-3E have different size and/or different shape with respect to the nanocrystals of the other layers 2A-2E, 3A-3E.

More precisely, the layers 2A-2E, 3A-3E are advantageously sorted in such an order that the superlattice structure 10 is anisotropic (i.e. it exhibits properties with different values when measured along axes in different directions).

Even more precisely, the superlattice structure 10 is anisotropic along the cross direction Y along which the electrical conductivity is required.

In other words, the superlattice structure 10 consist in a matrix of nanocrystals 21-25, 31-35 that is anisotropic along the transverse direction Y and is isotropic along the other two orthogonal directions. As an effect of this feature, in the superlattice structure 10 there is a preferential direction (i.e. the cross direction Y) for the electrons e⁻ to flow, as will become better apparent hereinafter.

For example, in the preferred embodiment depicted in FIG. 2, the nanocrystals 21-25 of the first 2A, third 2B, fifth 2C, seventh 2D and ninth 2E layers (hereinafter "odd layers 2A-2E") have the same shape; however the nanocrystals have a different size in each one of the odd layers 2A-2E and, more precisely, the size of the nanocrystals 21-25 decreases along the cross direction Y: the size of the nanocrystals 21 of the first layer 2A is greater than the size of the nanocrystals 22 of the third layer 2B, which is greater than the size of the nanocrystals 23 of the fifth layer 2C, and so on.

Similarly, the nanocrystals 31-34 of the second 3A, fourth 2B, sixth 3C and eighth 3D layers (hereinafter "even layers 3A-3D") have the same shape; however the nanocrystals 31-34 have a different size for each one of the even layers 3A-3D and, more precisely, the size of the nanocrystals 31-34 decreases along the cross direction Y: the size of the nanocrystals 31 of the second layer 3A is greater than the size of the nanocrystals 32 of the fourth layer 3B, which is greater than the size of the nanocrystals 33 of the sixth layer 3C, and so on.

In general, then, all the layers 2A-2E, 3A-3E are sorted by the size of the nanocrystals 21-25, 31-34 in ascending or descending order along the cross direction Y along which the electrical conductivity is required.

In fact, the energy gap in a nanocrystal (i.e. the difference of energy between the bottom of the conduction band and the top of the valence band of the electrons) is inversely proportional to the size of the nanocrystal and therefore in the superlattice structure 10, according to the disclosure, the electrons e⁻ are induced to flow along the cross direction Y, from the first layer 2A towards the last layer (the ninth layer 2E in the example), and not vice versa.

It should be noted that within the superlattice structure 10, the nanocrystals are fixed in predetermined positions in such a way that they have energetic alignment. In practice, the energy gaps of the nanocrystals are aligned so as to allow the electrons e⁻ (excited by the solar radiation S absorption) to transverse the whole superlattice structure 10.

In the preferred embodiS of the solar cell 1, the superlattice structure 10 is interposed between a first conductor contact 91 and a second conductor contact 92 (e.g. electrodes) and the layers 2A-2E, 3A-3E are sorted by the size of the nanocrystals in ascending order from the first conductor contact 91 towards the second conductor contact 92, so that the electrons e⁻ flow along the cross direction Y towards the second conductor contact 92 (and consequently the current c flows in the opposite direction).

With respect to the preferred embodiments of the superlattice structure 10, the layers 2A-2E, 3A-3E preferably comprise:

layers of a first type 2A-2E which comprise nanocrystals 21-25 having a first shape, layers of a second type 3A-3D which comprise nanocrystals 31-34 having a second shape that is different from said first shape.

As can be understood by looking at the figures, all the odd layers 2A-2E are layers of the first type 2A-2E and all the even layers 3A-3D are layers of the second type: in practice, the layers of the first type 2A-2E are alternated with the layers of the second type 3A-3D, in a regular pattern.

In the illustrated and not limiting example, the first shape (i.e. the shape of the nanocrystals 21-25 of the odd layers 2A-2E) is hexadecahedronal and the second shape (i.e. the shape of the nanocrystals 31-34 of the even layers 3A-3D) is pentahedronal.

In other embodiments (not shown), the first and/or the second shapes are different, for example octahedral, cuboctahedral, hexagonal, etc. . . . .

In other embodiments (not shown), all the nanocrystals 21-25, 31-34 of all the layers 2A-2E, 3A-3E (i.e. all of the nanocrystals 21-25, 31-34 comprised in the superlattice structure 10) have the same shape; in these embodiments the sizes of the nanocrystals is different in different layers, and preferably the size of the nanocrystals 31-34 decreases along the cross direction Y: the size of the nanocrystals of the first layer is greater than the size of the nanocrystals of the second layer, which in turn is greater than the size of the nanocrystals of the third layer, which in turn is greater than the size of the nanocrystals forth layer, and so on.

In yet other embodiments (not shown), all the nanocrystals 21-25, 31-34 of all the layers 2A-2E, 3A-3E (i.e. all of the nanocrystals 21-25, 31-34 comprised in the superlattice structure 10) have substantially the same size and only the shape of the nanocrystals varies (along the cross direction Y).

It should be noted then that, within the superlattice structure 10, the nanocrystals 21-25, 31-34 are fixed in predetermined positions in such a way that they have a shape directional alignment.

In greater detail, the shapes and the orientations of the nanocrystals 21-25, 31-34 are provided so that the nanocrystals 21-25, 31-34 have not only an energetic alignment, but also a mechanical alignment.

In even greater detail, the shapes and the orientations of the nanocrystals 21-25, 31-34 are chosen so as to minimize the energy barriers due to the geometry of the nanocrystals 21-25, 31-34 between each nanocrystal 21-25, 31-34 and the nanocrystals 21-25, 31-34 which are adjacent along the cross direction Y and so the electrons e⁻ are even more induced to flow along the cross direction Y, from the last layer (the ninth layer 2E in the example) towards the first layer 2A.

The mechanical alignment is obtain by coordinating the layers to be geometrically compatible, meaning that the top layer will fit the bottom layer alignment so the nanocrystals will be settled together.

Ultimately, in the preferred embodiments, the nanocrystals 21-25, 31-34 are fixed in predetermined positions, within said layers 2A-2E, 3A-3E, in such a way that they have both an energetic and a mechanical alignment.

Advantageously, the gaps and connections between the nanocrystals 21-25, 31-34 is controlled by the Ligand molecules that are connected to the nanocrystals 21-25, 31-34.

As a result of the synergistic combination of such energetic and mechanical alignment, within the superlattice structure 10, there is a very high probability that an electron e⁻ excited in a nanocrystals 21-25, 31-34 as a result of the absorption of a photon of the solar radiation "jumps" (moves) to the nanocrystal 21-25, 31-34 that is adjacent in the cross direction Y towards the second conductor contact 92 and there is a very low probability that such electron e⁻ "jumps" (moves) to the other nanocrystals 21-25, 31-34 which are adjacent in the other directions.

Further, as a result of the peculiar sizes of the nanocrystal 21-25, 31-34 within the superlattice structure 10, there is an enhanced probability of multiple exciton generation (i.e. probability that the absorption of a single photon leads to the excitation and emission of multiple electrons) and therefore the superlattice structure 10 according to the disclosure is able to exceed the Shockley-Queisser efficiency limit.

Furthermore, the different shapes and sizes of the nanocrystals 21-25, 31-34 provide a polychromatic response, since every type of nanocrystals 21-25, 31-34 absorbs a different portion of the solar radiation S spectrum, so that, in the preferred embodiments, the absorption efficiency is higher than the known single junction cells.

All the combined above mentioned advantageous effects allow to reach, in the preferred embodiments of the solar cell according to the disclosure, an efficiency of more than 40%.

As to the composition of the nanocrystals 21-25, 31-34, they are made of semiconductor materials such as: CdS, CdSe, CdTe, InP, InAs, ZnS, ZnSe, HgTe, GaN, GaP, GaAs, GaSb, InSb, Si, Ge, AlAs, AlSb, PbSe, PbS, PbTe, InGaAs, InGaN, AlInGaP.

In the preferred embodiments, the nanocrystals 21-25, 31-34 are made of one or more of the following materials: PbSe, PbS, PbTe, CdS, CdSe, CdTe.

Preferably, all the nanocrystals 21-25, 31-34 are made of the same material.

However, in some embodiments, optionally, the nanocrystals 21-25 of the odd layers 2A-2E are made of a first material and the nanocrystals 31-34 of the even layers 3A-3D are made of a second material that is different from said first material, so that nanocrystals 21-25 of the first material are alternated with nanocrystals 21-25 of the second material along the cross direction Y, in a regular pattern.

All the nanocrystals 21-25, 31-34 have a size (i.e. the maximum dimension) that is less than the Bohr radius of the substance they are made of.

The superlattice structure 10, according to the disclosure, is also very easy to manufacture.

A method for making a superlattice structure 10 for a thin film solar cell 1, according to the disclosure, comprises a process of depositing, in sequence, a series of layers 2A-2E, 3A-3E having the features described above.

In general, the method for making a superlattice structure 10 comprises the steps of:

a. depositing a first layer 2A comprising an array of first nanocrystals 21 which have a first shape and a first size;

b. depositing on said first layer 2A a second layer 3A comprising an array of second nanocrystals 31 which have a second shape and a second size, said second shape being different from said first shape and/or said second size being different from said first size;

c. depositing on said second layer 3A a third layer 2B comprising an array of third nanocrystals 22 which have said first shape and a third size, said third size being preferably different from said first size (and even more preferably greater than said first size);

d. depositing on said third layer 2B a forth layer 3B comprising an array of forth nanocrystals 32 which have said second shape and a forth size, said forth size being preferably different from said second size (and even more preferably greater than said second size);

and so on, until a predetermined number of layers 2A-2E, 3A-3E is reached.

In the preferred embodiments, said second shape is different from said first shape.

In other embodiments, said first shape and said second shape are the same and, preferably, said first size is greater than said second size which is greater than said third size which is greater than said forth size, and so on.

In some of the embodiments wherein said second shape is different from said first shape, said first size, said second size, said third size, and said forth size are the same (and so the size of all the nanocrystals is the same).

Optionally, the first layer is deposited on a transparent conductive material such as (and not limited to) ITO and FTO.

Optionally, on top of the last layer 2E, a conductor contact 91 (e.g. an electrode) is placed.

The layers 2A-2E, 3A-3E can be deposited by any known technique capable of depositing an uniform and conformal thin film, such as inkjet techniques, atomic layer deposition, spin coating, dip coating, cast coating phase separation, etc.

In some embodiments, the thin film solar cell 1 comprises other active layers (of the ones already known in the field), in addition to the superlattice structure 10.

The operation of the superlattice structure and of the thin film solar cell comprising the superlattice structure is clear and evident from what has been described above.

In practice it has been found that the superlattice structure according to the present disclosure achieves the intended aim and objects, since it allow to improve the efficiency of a thin film solar cell with respect to prior art.

Another advantage of the superlattice structure, according to the disclosure, resides in that it allows to provide a thin film solar cell that is highly versatile.

A further advantage of the superlattice structure, according to the disclosure, resides in that it is highly reliable, relatively easy to manufacture and at competitive costs.

Furthermore the superlattice structure, according to the disclosure, provides an alternative to known solutions.

The disclosure thus devised is susceptible of numerous modifications and variations, all of which are within the scope of the inventive concept; all the details may furthermore be replaced with other technically equivalent elements.

In practice, the materials used, as well as the dimensions, may be any according to the requirements and the state of the art.

Scope of the disclosure is thus indicated by the appended claims, rather than the foregoing description, and all changes that come within the meaning and range of equivalence of the claims are therefore intended to be embraced therein.

The invention claimed is:

1. A method for making a superlattice structure for a thin film solar cell, the method including at least the following steps:
   a. depositing a first layer comprising an array of first nanocrystals which have a first shape and a first size,
   b. depositing on said first layer a second layer comprising an array of second nanocrystals which have a second shape and a second size, said second shape being different from said first shape,
   c. depositing on said second layer a third layer comprising an array of third nanocrystals which have said first shape and a third size, and
   d. depositing on said third layer a fourth layer comprising an array of fourth nanocrystals which have said second shape and a fourth size;
   wherein said third size is greater than said first size and said fourth size is greater than said second size, so that said layers are sorted by the size of the nanocrystals in ascending or descending order along a cross direction along which the electrical conductivity is required;
   wherein said nanocrystals having a size that is less than the Bohr radius of the substance they are made of.

2. The method according to claim 1, wherein said nanocrystals are made of one or more of the following materials: CdS, CdSe, CdTe, InP, InAs, ZnS, ZnSe, HgTe, GaN, GaP, GaAs, GaSb, InSb, Si, Ge, AlAs, AlSb, PbSe, PbS, PbTe, InGaAs, InGaN, and AlInGaP.

3. The method structure according to claim 2, wherein said nanocrystal are made of one or more of the following materials: PbSe, PbS, PbTe, CdS, CdSe, and CdTe.

* * * * *